United States Patent [19]
Shibata et al.

[11] 4,456,318
[45] Jun. 26, 1984

[54] IC SOCKET

[75] Inventors: Sueji Shibata, Tokyo; Shoji Umesato, Fuchu, both of Japan

[73] Assignees: Yamaichi Electric Mfg. Co., Ltd.; Nippon Electric Co., Ltd., both of Tokyo, Japan

[21] Appl. No.: 407,133

[22] Filed: Aug. 11, 1982

[30] Foreign Application Priority Data
Aug. 11, 1981 [JP] Japan ............................. 56-125562

[51] Int. Cl.³ ............................................. H01R 23/68
[52] U.S. Cl. ............................. 339/17 CF; 339/75 MP
[58] Field of Search .......... 339/17 CF, 75 M, 75 MP, 339/91 R, 176 M, 176 MP

[56] References Cited
U.S. PATENT DOCUMENTS

| 3,409,861 | 11/1968 | Barnes et al. | 339/17 CF |
| 3,831,131 | 8/1974 | Woodcock et al. | 339/17 CF |
| 3,904,262 | 9/1975 | Cutchan | 339/75 MP |
| 4,260,210 | 4/1981 | Babuka et al. | 339/75 M |

Primary Examiner—John McQuade
Attorney, Agent, or Firm—Wenderoth, Lind & Ponack

[57] ABSTRACT

An IC socket for a flat IC package comprises a socket substrate, a cover member, a rotary lever, and a locking/unlocking mechanism so as to obtain stable, reliable contact and stable, easy release of contact between the conductors of the flat IC package and the contact pieces of the IC socket. The locking/unlocking mechanism makes use of sliding movement of the cover member on the socket substrate on the basis of the rotation of the rotary lever.

7 Claims, 8 Drawing Figures

IC SOCKET

BACKGROUND OF THE INVENTION

The present invention relates to an IC socket capable of effectively obtaining reliable contact with an IC package.

Generally, a flat rectangular IC package is provided on the periphery thereof with two to four aligned rows of leads or foils which become outside terminals of an integrated circuit (hereinafter referred to as conductors), whereas an IC socket has a central space for accommodation of the IC package and is provided on the periphery of the central space with two to four aligned rows of contacts conforming to the alignment of the conductors. By accommodating the IC package in the IC socket, the conductors and the contacts are brought into abuttment with each other. This contact is retained by providing on the IC socket a means for pressing down either the IC package or the portion of contact and preventing it from floating.

When a cover member is used as the pressing-down means, pivotally attached to one side of the IC socket and closed relative to the IC socket against the elasticity of the conductors and the contacts, however, the cover member is required to have a width large enough to cover at least the entire surface of the area in which the conductors and the contacts in two to four rows are disposed. When the free end of the cover member is engaged with a locking lever provided on the opposite end of the IC socket under a springing-back phenomenon between the conductors and the contacts so as to retain the cover member in a closed state, the cover member cannot prevent the central portion thereof from being warped, with the result that the reliability of contact is decreased.

OBJECTS AND SUMMARY OF THE INVENTION

One object of the present invention is to provide an IC socket with a locking/unlocking mechanism, which is capable of effectively obtaining reliable contact with an IC package.

Another object of the present invention is to provide an IC socket with a locking/unlocking mechanism, which is capable of easily actuating the locking/unlocking mechanism.

To attain the objects described above according to the present invention, there is provided an IC socket comprising a socket substrate, a cover member, a rotary lever and a locking/unlocking mechanism which makes use of sliding movement of the cover member on the socket substrate on the basis of the rotation of the rotary lever.

The aforementioned and other objects and characteristic features of the present invention will become apparent from the further disclosure of the invention to be made hereinbelow with reference to the accompanying drawings.

DESCRIPTION OF THE PREFERRED EMBODIMENT

Figure 1:
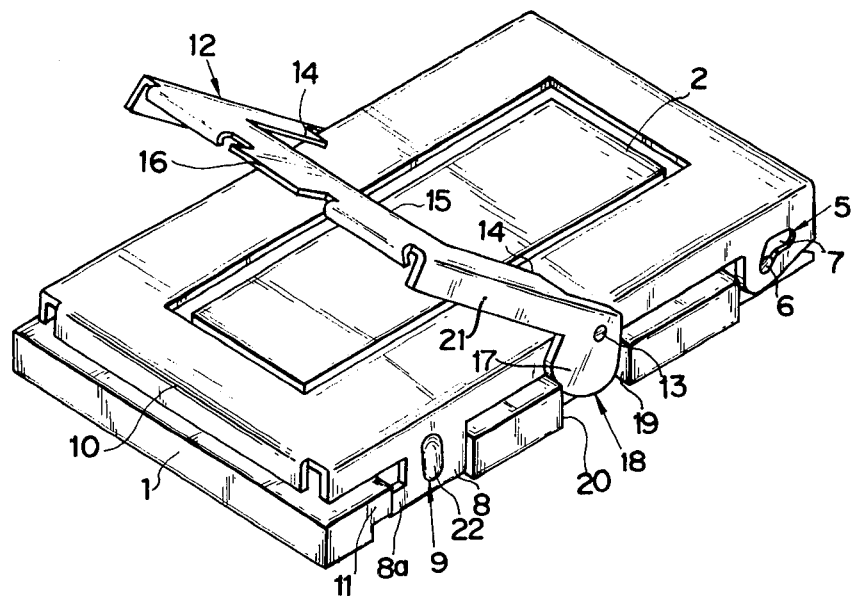
FIG. 1 is a perspective view illustrating one embodiment of an IC socket according to the present invention.

An IC socket of the present invention is advantageously used for a flat IC package having conductors projecting sidewards and comprises a socket substrate having contact pieces planted therein, a cover member for retaining contact between the conductors and the contact pieces, and a locking/unlocking mechanism for causing the cover member to be easily engaged with and disengaged from the socket substrate.

The present invention will now be described with reference to the illustrated embodiment.

Reference numeral 1 denotes a socket substrate constituting an IC socket, and denoted by reference numeral 2 is a flat IC package. As is well-known to the art, in IC sockets of this type, the flat IC package 2 as a single unit or a combination of the IC package and a carrier 2' is disposed on the socket substrate 1, thereby allowing conductors 3 projecting sidewards in a substantially horizontal direction from the IC package to be put on contact pieces 4 planted in the socket substrate 1 so as to obtain contact therebetween. This contact is retained generally by pushing the conductors 3 from above to the contact pieces against the spring force of the contact pieces.

The pushing means of the present invention comprises a cover member 10 attached to the socket substrate 1 and a rotary lever 12. The cover member 10 is attached to the socket substrate 1 at the lateral sides of the base end thereof by hinge means 5. The hinge means 5 allow the cover member 10 to be swung, i.e. closed and opened relative to the socket substrate 1, and to be reciprocatively slid when being closed or opened relative to the socket substrate. The hinge means are constructed, for example, by providing the lateral sides of one end of the socket substrate 1 with stationary pins 6 and boring slide holes 7 in the lateral sides of the base end of the cover member 10 so as to allow the pins 6 to be guided along the walls of the slide holes 7.

Figure 2:
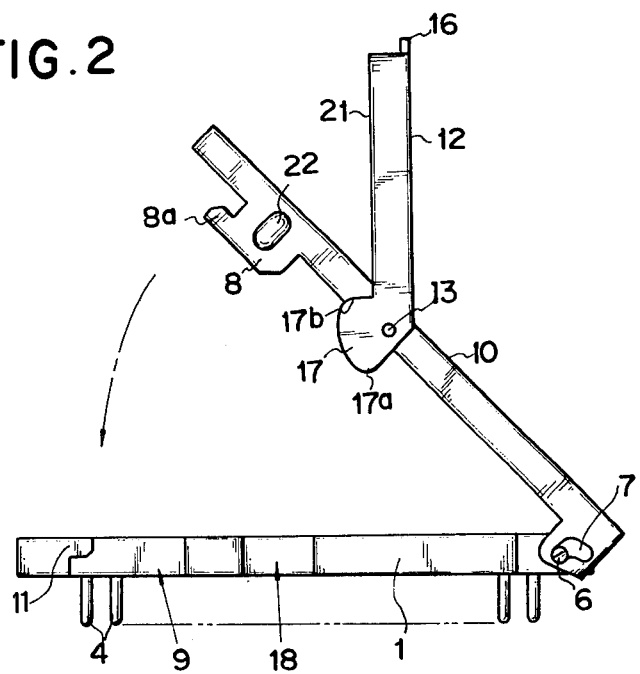
FIG. 2 is a side view of the embodiment with a cover member in an opened state relative to a socket substrate.
Figure 3:
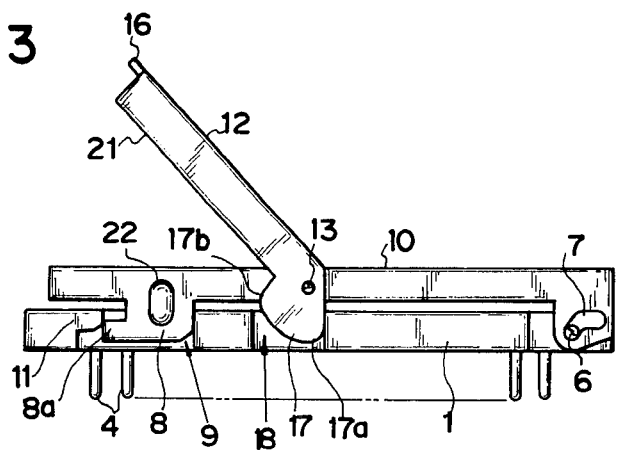
FIG. 3 is a side view of the embodiment with the cover member in a closed state relative to the socket substrate.

As is illustrated in FIGS. 2 and 3, the cover member 10 can freely be swung in either an opening or a closing direction with the stationary pins as the fulcrums and also slid in the range of the slide holes 7 allowing the stationary pins 6 to be guided. The cover member 10, after being closed relative to the socket substrate 1, is slid on the upper surface of the socket substrate 1. This sliding movement causes the cover member 10 to be engaged with or disengaged from the socket substrate 1. This engagement is effected by having the lateral sides of the cover member 10 provided one each with L-shaped latches 8 extending toward the side surfaces of the socket substrate 1, having the lateral sides of the socket substrate 1 provided one each with guide grooves 9, accommodating the latches 8 within the guide grooves 9 by closing the cover member 10 relative to the socket substrate and, sliding the latches 8 within the guide grooves 9 in one same direction by sliding the cover member 10, thereby inserting engaging pawls 8a provided on the latches 8 so as to extend in the sliding direction into the undersides of engaging walls 11 provided on the inner walls of the guide grooves 9 so as to extend in the opposite direction. As a result, the cover member 10 is locked against swinging in its opening direction and kept closed relative to the socket substrate 1. In this state, the conductors 3 and the contact pieces 4 are brought into forced contact with each other and retained in that state. The aforementioned disengagement is effected by merely sliding in the opposite direction the cover member 10 which has been retained in the locked state, thereby allowing the cover member 10 to be swung in the opening direction. The IC package 2 or the combination of the IC package and the carrier 2' can be detached from or attached to the socket substrate 1 by opening the cover member 10 relative to the socket substrate. Further, two or more pairs of L-shaped latches 8 and guide grooves 9 may optionally be provided respectively on the cover member 10 and in the socket substrate 1.

Figure 4:
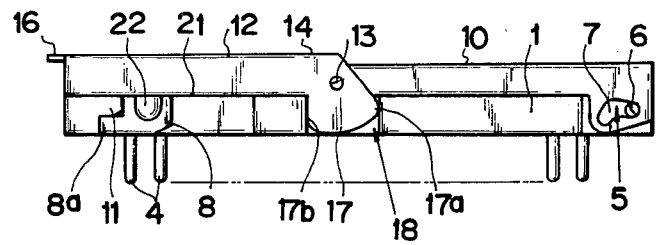
FIG. 4 is a side view of the embodiment with a rotary lever falling down so as to actuate a locking mechanism.
Figure 5:
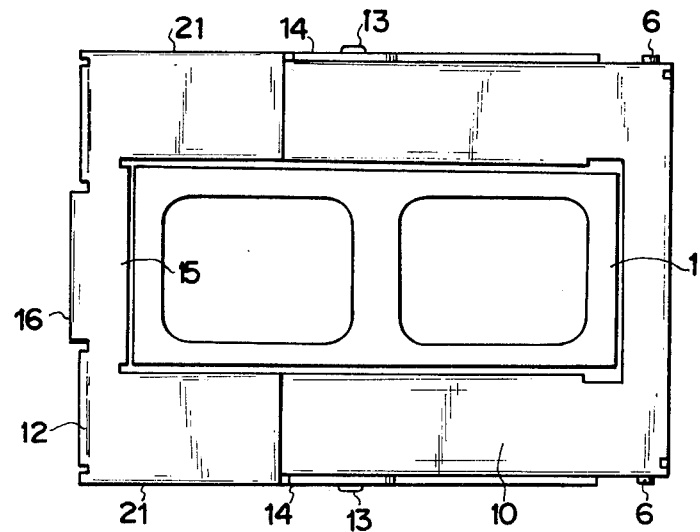
FIG. 5 is a plan view of the embodiment.
Figure 6A:
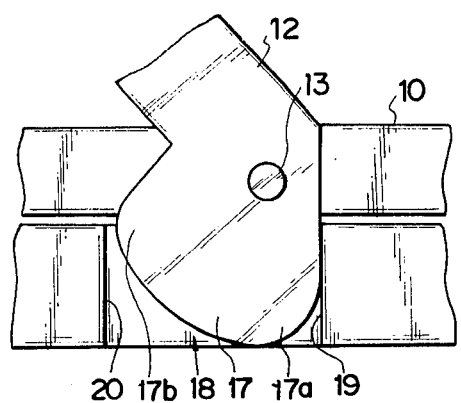
FIGS. 6A and 6B are enlarged side views illustrating the states of the movement of a guide plate portion of the rotary lever.
Figure 6B:
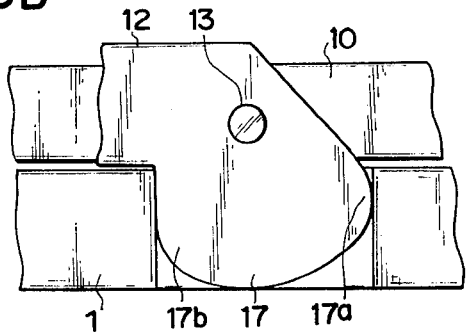
Figure 7:
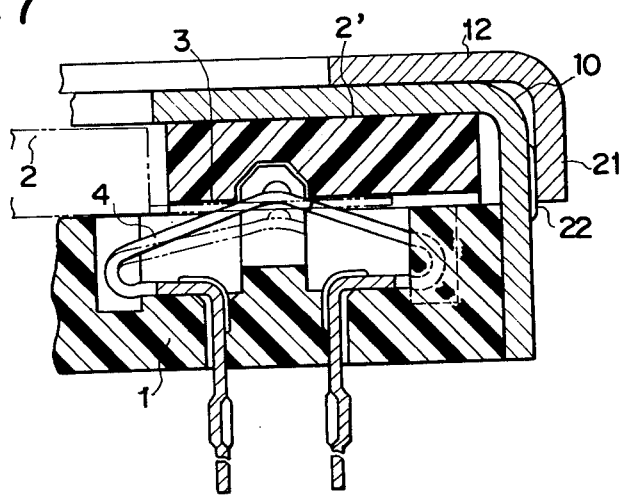
FIG. 7 is an enlarged cross-sectional view illustrating the portion of contact between a conductor and a contact.

To the cover member 10 is rotatably attached the rotary lever 12 which is formed in the shape of a clamp so that it may rise and fall relative to the cover member 10 for the purpose of stably effecting the aforementioned sliding reciprocation, engagement and disengagement of the cover member 10. To be more specific, the rotary lever 12 comprises a pair of arms 14 pivotally attached to the lateral sides of the cover member 10 by means of pivots 13, a connection bar 15 for integrally connecting the pair of arms, a knob piece 16 integrally formed with the connection bar 15 so that it protrudes over the forward edge of the cover member 10 when the rotary lever 12 is pivoted down to the cover member 10 as shown in FIG. 4, and guide plates 17 integrally formed one each with the arms 14 at positions in the vicinity of the pivots 13. Each of the guide plates 17 is slide-inserted from above into a guide plate accommodation groove 18 formed in the lateral side of the socket substrate 1 when the cover member 10 is being closed relative to the socket substrate 1 and rotated in the same direction as the direction in which the rotary lever 12 is rotated. The guide plate 17 has a first guide portion 17a and a second guide portion 17b, formed on the peripheral surface thereof. The first guide portion 17a and the second guide portion 17b are set by the distances from the rotation fulcrums (pivots 13) respectively determined by the correlation with first and second regulation walls 19 and 20 of accommodation groove 18 to be described hereinbelow. The surfaces of the first and second guide portions 17a and 17b are shaped such that the distance from points therealong to the pivots 13 increases in a generally downward direction.

By rotating the rotary lever 12 to fall down to the cover member 10 which has been kept in its closed state, the first guide portion 17a is brought into rotational sliding contact with the first regulation wall 19 which is one of the inner walls of the accommodation groove 18 and, in proportion as the rotational sliding contact proceeds, the rotary lever 12 urges itself to be displaced in one direction in such a manner that the distance between the first regulation wall 19 and the pivot 13 is gradually increased. As a consequence, the cover member 10 united with the rotary lever 12 by means of the pivots 13 is slid in parallel to the socket substrate 1 in the same direction by the amount corresponding to the increased distance, and the engaging pawls 8a of the L-shaped latches 8 are engaged into the undersides of the engaging walls 11. When the rotary lever 12 has been pivoted down into flush contact with the upper surface of the cover member 10, the engagement between the engaging pawls 8a and the engaging walls 11 is completed and, at the same time, the cover member 10 is locked against rotation in its opening direction. The rotary lever 12 is provided with a pair of splice pieces 21 each extending from the arm 14 toward the lateral side of the cover member 10, whereas the cover member 10 is provided on the lateral sides thereof with protuberances 22 which are to collide with the inner walls of the splice pieces 21 under suitable friction and pressure. This construction can effectively retain the rotary lever 12 in a closed state flush with cover member 10 as shown in FIG. 4. It goes without saying that protuberances 22 may alternately be formed on the inner surfaces of the splice pieces 21. When the locking of the cover member 10 has been completed, the conductors 3 of the flat IC package 2 are brought into pressure contact with the contact pieces 4 of the socket substrate 1 and this contact state is retained stably. Further, an insulation may be interposed between the cover member 10 and the conductors 3 thereby indirectly pushing the conductors 3 with the cover member 10. Optionally, the pushing force by means of the cover member 10 may be given to the IC package 2 itself.

The second guide portion 17b, when the rotary lever 12 rotated up from its closed state on the cover member 10, is brought into rotational sliding contact with the second regulation wall 20 which is the other of the inner walls of the accommodation groove 18 and, in proportion as the rotational sliding contact proceeds, the rotary lever 12 urges itself to be displaced in the other direction in such a manner that the distance between the second regulation wall 20 and the pivot 13 is gradually increased. As a result, the cover member 10 united with the rotary lever 12 by means of the pivots 13 is slid in parallel to the socket substrate 1 in said other direction by the amount corresponding to the increased distance, and the engaging pawls 8a of the L-shaped latches 8 are disengaged from the undersides of the engaging walls 11. The cover member 10 is thus released from the socket substrate 1. Since the cover member 10 can freely be rotated in its openiing direction, after this release, the IC package 2 and the carrier 2' can easily be detached from the socket substrate 1 and vice versa. The knob piece 16 is advantageously used when the rotary lever 12 is rotated upward from the cover member 10.

As described above, according to the present invention, mere rotation of the rotary lever toward and away from cover member 10 allows the cover member to be easily smoothly slid on the socket substrate in its locking and unlocking directions and thereby the attachment and detachment of the IC package and the connection and disconnection between the conductors and the contact pieces can easily be effected rapidly. Further, since the rotation of the rotary lever is easily converted into sliding of the cover member, the conversion mechanism can reduce the number of the component parts to the minimum number and does not obstruct a recent tendency toward the reduction in thickness of IC sockets.

Furthermore, the IC socket according to the present invention is considerably advantageous from designing and manufacturing points of view, insofar as the adjustment in movement between the socket substrate and the guide plates can be obtained, because the rotary lever and the cover member are handled as one integral part and because the rotational and lateral movements of the rotary lever are associated with the sliding movement of the cover member.

The present invention may be put to practical use, as occasion demands, in either the case where the cover member and the socket substrate are formed as mutually separable parts or the case, as in the illustrated embodiment, where the two parts are united by utilization of the sliding engagement between the stationary pins and the slide holes so that the cover member may be rotated in its opening and closing directions and slid relative to the socket substrate. In the latter case, the mutual attachment and detachment of the two parts can be omitted and the two parts can be handled substantially as one integral assembly.

What is claimed is:

1. In an IC socket which includes a socket substrate having planted therein a plurality of contact pieces on which an equal number of conductors provided on a flat IC package are disposed, and a cover member adapted to be opened and closed relative to the upper surface of said socket substrate and to press from above one of said flat IC package and said conductors disposed on the contact pieces, thereby causing the conductors to come into contact with the contact pieces, the improvement wherein:

said cover member is retained on said socket substrate so as to be laterally reciprocatively movable along the upper surface of said socket substrate; and said IC socket comprises means for locking said cover member in said socket substrate by the lateral movement of said cover member in one direction to be retained in a closed state relative to said socket substrate and unlocking said cover member by the lateral movement of said cover member in the other direction to become in an openable state relative to said socket substrate;

said means including a rotary lever attached pivotally to said cover member so as to be pivotable about an axis of rotation in directions toward and away from said cover member and provided integrally with a pair of guide plates around said axis of rotation, each guide plate including a first guide portion and a second guide portion;

said socket substrate having a pair of first regulation walls and a pair of second regulation walls, said rotary lever being pivotable downward so as to bring the first guide portions of said guide plates into rotational engagement with said first regulation walls and being pivotable upward so as to bring the second guide portions of said guide plates into rotational engagement with said second regulation walls, said guide portions and said first and second regulation walls being so shaped that the distance from said axis of rotation to the location of engagement between said first guide portions and said first regulation walls increases with pivotal movement of said rotary lever toward said cover member, thereby to move said rotary lever and said cover member in said one direction to lock said cover member in said socket substrate, and that the distance from said axis of rotation to the location of engagement between said second guide portions said second regulation walls increases with pivotal movement of said rotary lever away from said cover member, thereby to move said rotary lever and said cover member in said other direction to unlock said cover member from said socket substrate.

2. The improvement according to claim 1, wherein said cover member is pivotally attached to one end side of said socket substrate so as to be laterally reciprocatively moved along the upper surface of said socket substrate.

3. The improvement according to claim 1, wherein said rotary lever comprises a pair of arms pivotally attached to the lateral sides of said cover member, and a connection bar which connects said pair of arms and has a knob piece.

4. The improvement according to claim 1, wherein said socket substrate includes downwardly extending accommodation grooves formed in the lateral sides thereof, said pair of first regulation walls and said pair of second regulation walls comprising the inner walls of said accommodation grooves, and said pair of guide plates being slide-inserted into respective ones of said accommodation grooves.

5. The improvement according to claim 1, wherein said means comprises latches provided on the lateral sides of said cover member, engaging pawls integrally formed with said latches, guide grooves formed in the lateral sides of said socket substrate, and engaging walls provided on the inner walls of said guide grooves so as to respectively engage and disengage said engaging pawls when said cover is moved in said one and said other directions, said cover member being respectively locked and unlocked by engagement and disengagement between said engaging pawls and said engaging walls.

6. The improvement according to claim 4, wherein said first and second regulation walls of each of said accommodation grooves comprise mutually facing vertical walls and said first and second guide portions comprise outer surfaces of said guide plates, the distance from points along said first and second guide portions to said axis of rotation increasing in a generally downward direction.

7. The improvement as in claim 1, further comprising an insulation interposed between said conductors and said cover member.

* * * * *